(12) United States Patent
Chung et al.

(10) Patent No.: US 8,415,764 B2
(45) Date of Patent: Apr. 9, 2013

(54) HIGH-VOLTAGE BJT FORMED USING CMOS HV PROCESSES

(75) Inventors: Tao-Wen Chung, Zhubei (TW); Po-Yao Ke, Kaohsiung County (TW); Wei-Yang Lin, Yunlin County (TW); Shine Chung, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 341 days.

(21) Appl. No.: 12/750,503

(22) Filed: Mar. 30, 2010

(65) Prior Publication Data
US 2010/0301453 A1 Dec. 2, 2010

Related U.S. Application Data

(60) Provisional application No. 61/183,420, filed on Jun. 2, 2009.

(51) Int. Cl.
*H01L 27/082* (2006.01)

(52) U.S. Cl. ........ 257/574; 257/565; 257/575; 438/204; 438/207; 438/236; 438/327; 438/336

(58) Field of Classification Search .................. 257/565, 257/574, 575, E27.023, E27.026, E29.199, 257/E29.184, E29.187; 438/204, 207, 236, 438/327, 336
See application file for complete search history.

(56) References Cited

U.S. PATENT DOCUMENTS

| | | | |
|---|---|---|---|
| 7,663,445 B2 | 2/2010 | Chung et al. | |
| 7,723,803 B2 | 5/2010 | Chung | |
| 2004/0253779 A1* | 12/2004 | Hong | 438/203 |
| 2007/0105301 A1* | 5/2007 | Chen et al. | 438/234 |
| 2009/0294798 A1 | 12/2009 | Chung et al. | |
| 2010/0320572 A1 | 12/2010 | Chung et al. | |

* cited by examiner

*Primary Examiner* — Ha Tran T Nguyen
*Assistant Examiner* — Suberr Chi
(74) *Attorney, Agent, or Firm* — Slater & Matsil, L.L.P.

(57) ABSTRACT

An integrated circuit device includes a semiconductor substrate having a top surface; at least one insulation region extending from the top surface into the semiconductor substrate; a plurality of base contacts of a first conductivity type electrically interconnected to each other; and a plurality of emitters and a plurality of collectors of a second conductivity type opposite the first conductivity type. Each of the plurality of emitters, the plurality of collectors, and the plurality of base contacts is laterally spaced apart from each other by the at least one insulation region. The integrated circuit device further includes a buried layer of the second conductivity type in the semiconductor substrate, wherein the buried layer has an upper surface adjoining bottom surfaces of the plurality of collectors.

20 Claims, 6 Drawing Sheets

HIGH-VOLTAGE BJT FORMED USING CMOS HV PROCESSES

This application claims the benefit of U.S. Provisional Application No. 61/183,420 filed on Jun. 2, 2009, entitled "High-Voltage BJT Formed Using CMOS HV Processes," which application is hereby incorporated herein by reference.

TECHNICAL FIELD

This invention relates generally to integrated circuits, and more particularly to high-voltage integrated circuits, and even more particularly to high-voltage bipolar junction transistors (BJTs) formed using standard high-voltage CMOS processes.

BACKGROUND

High-voltage devices are commonly used in integrated circuits, and may be used in input/output (IO) circuits, memory circuits, and the like. FIG. 1A illustrates a top view of a conventional high-voltage bipolar junction transistor (BJT). FIG. 1B illustrates a cross-sectional view of the structure as shown in FIG. 1A, wherein the cross-sectional view is taken along a plane crossing line 1B-1B. The BJT includes emitter E, collector C, and base contact B. Emitter E and collector C are of n-type, while base contact B is of p-type. Base contact B and the underlying p-well form the base of the BJT. Each of base contact B and collector C forms a ring encircling emitter E. Shallow trench isolation (STI) regions laterally space collector C apart from base contact B, and space emitter E apart from base contact B, so that a high voltage can be applied between collector C and emitter E.

Referring to FIG. 1B, collector C includes a heavily doped n-type region (N+) and a high-voltage n-well (HVNW), each forming a ring, and an n-type buried layer (NBL) underlying and connected to the HVNW. During the operation of the BJT, electrons may be injected into collector C from emitter E through paths denoted using arrows 110 and 112. Arrows 110 indicate lateral electron-injection paths, while arrows 112 indicate vertical electron-injection paths. It is noted that emitter E is laterally spaced apart from the HVNW by two STI regions and base contact B, and hence the lateral electron-injection path is long. Accordingly, the lateral electron-injection effect is weak, and the current gain of the BJT is mainly contributed to by the vertical electron-injection path (denoted by arrows 112).

Due to the lack of lateral electron-injection effect, the current gain of the BJT as shown in FIGS. 1A and 1B is low. In addition, the chip area usage of the BJT is not efficient. The BJT may occupy a chip area of 10 μm×10 μm. What is needed, therefore, is a structure for overcoming the above-described shortcomings in the prior art.

SUMMARY OF THE INVENTION

In accordance with one aspect of the present invention, an integrated circuit device includes a semiconductor substrate having a top surface; at least one insulation region extending from the top surface into the semiconductor substrate; a plurality of base contacts of a first conductivity type electrically interconnected to each other; a plurality of emitters of a second conductivity type opposite the first conductivity type, wherein the plurality of emitters is electrically interconnected to each other; and a plurality of collectors of the second conductivity type electrically interconnected to each other. Each of the plurality of emitters, the plurality of collectors, and the plurality of base contacts is laterally spaced apart from each other by the at least one insulation region. The integrated circuit device further includes a buried layer of the second conductivity type in the semiconductor substrate, wherein the buried layer has an upper surface adjoining bottom surfaces of the plurality of collectors.

Other embodiments are also disclosed.

The advantageous features of the present invention include increased current gain, reduced chip area usage, and lower base resistance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel high-voltage (HV) bipolar junction transistor (BJT) is provided. The variations and the operation of the embodiment are then discussed. Throughout the various views and illustrative embodiments of the present invention, like reference numbers are used to designate like elements. Throughout the description, NPN HVBJTs are discussed as exemplary embodiments. However, the teaching may also be applied to PNP HVBJTs, with the p-type and n-type regions inverted.

Figure 1A:
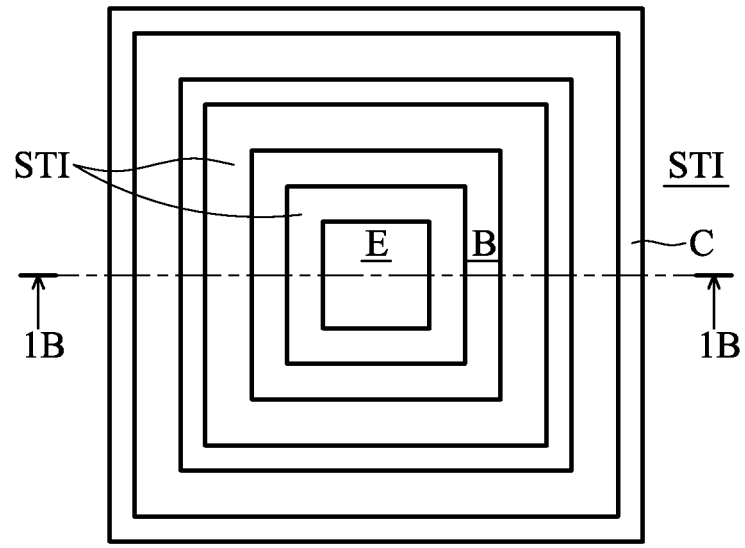
FIGS. 1A and 1B illustrate a top view and a cross-sectional view, respectively, of a conventional high-voltage bipolar junction transistor (HVBJT)
Figure 1B:
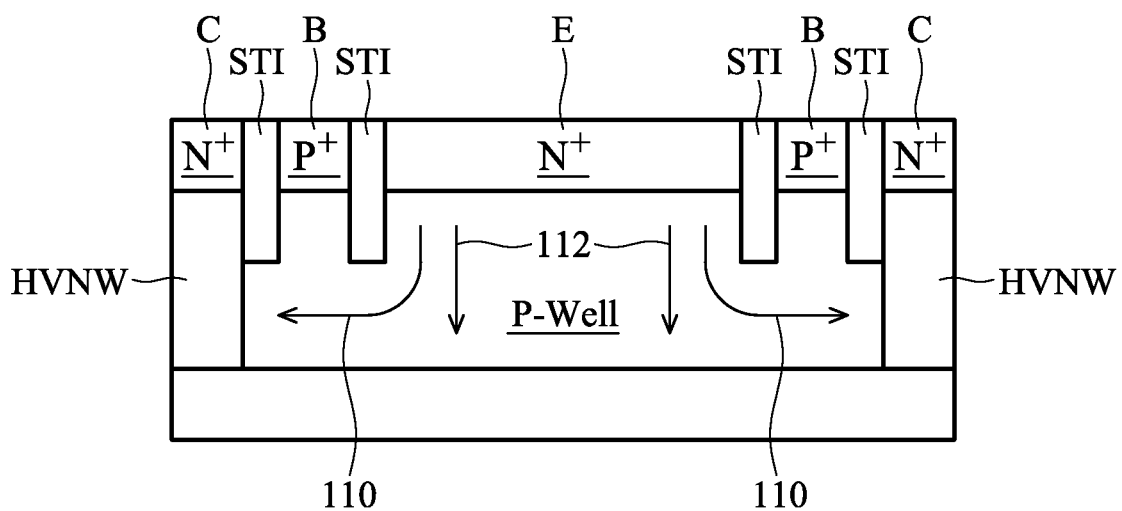
Figure 2A:
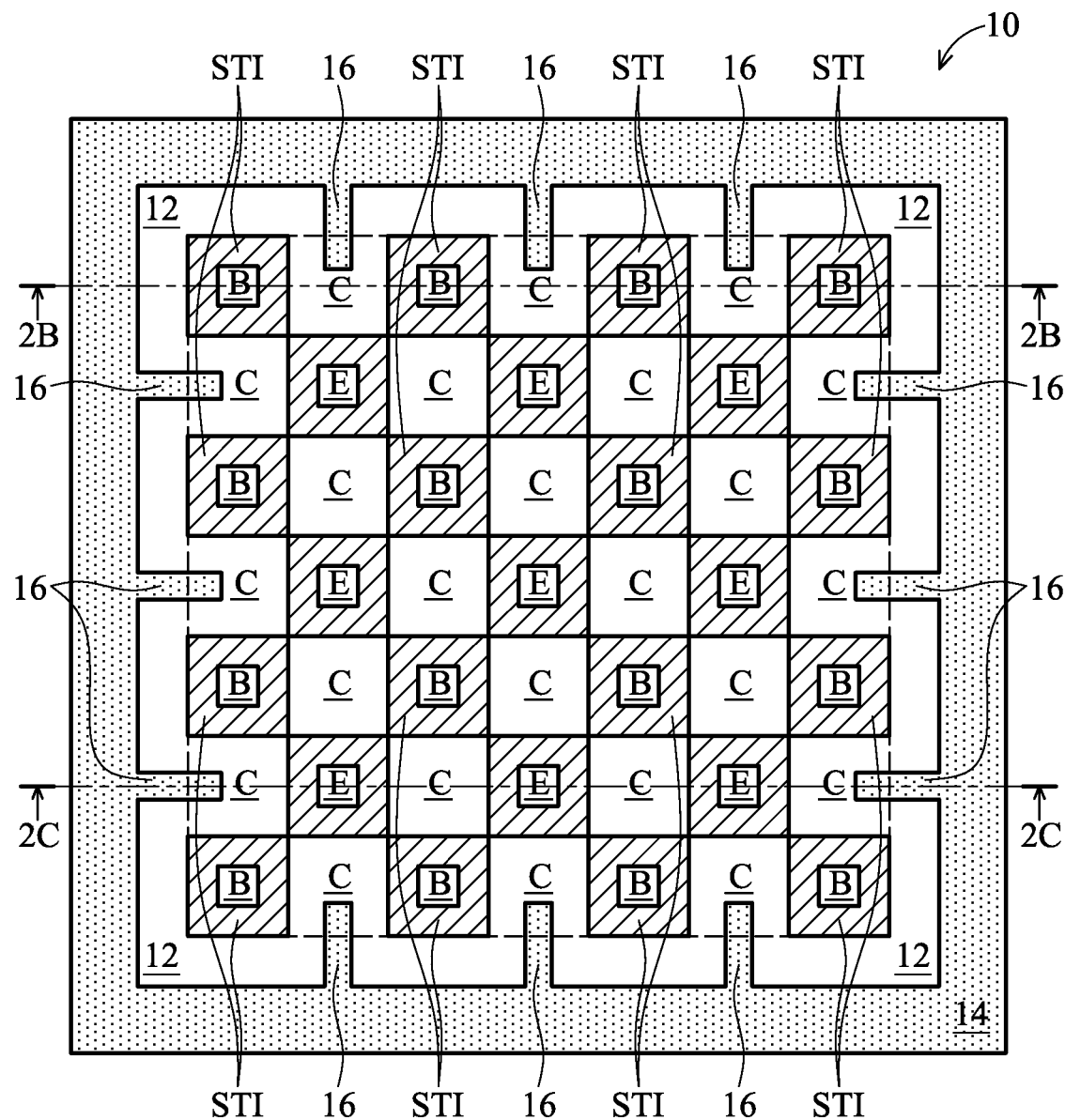
FIG. 2A and FIGS. 2B and 2C illustrate a top view and cross-sectional views, respectively, of a HVBJT having a mesh structure.
Figure 2B:
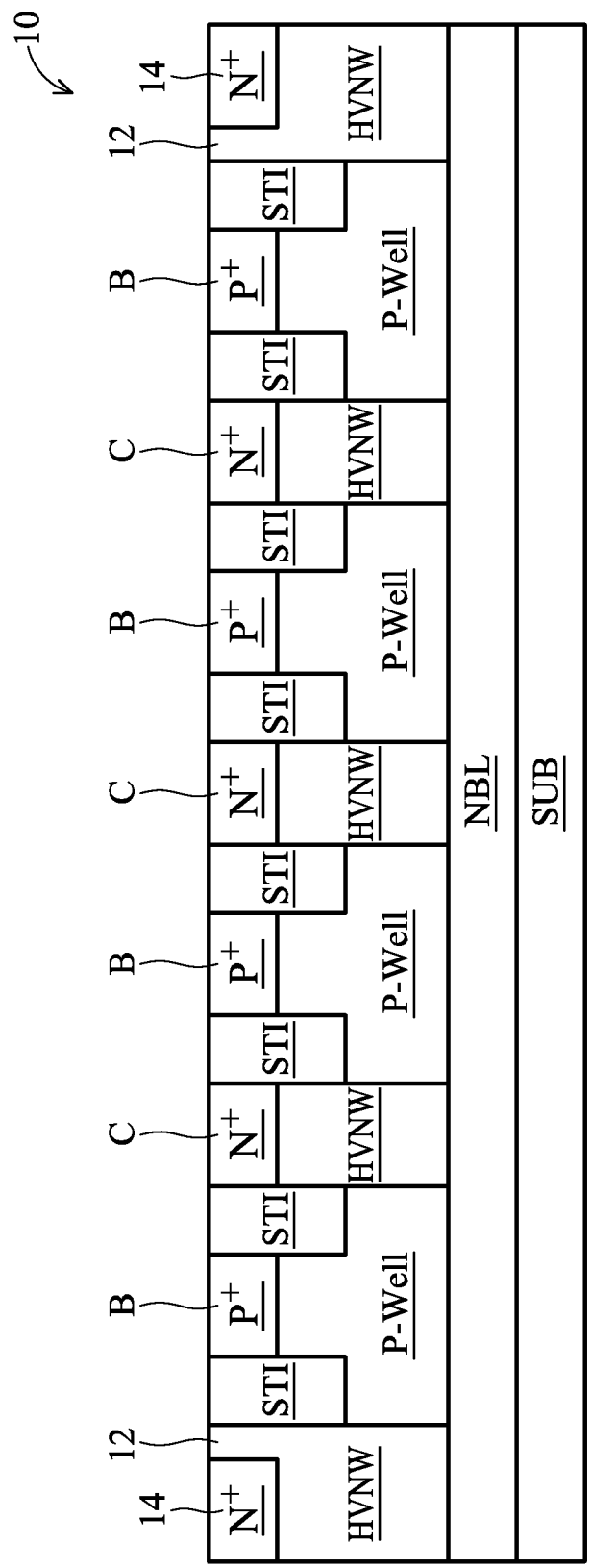
Figure 2C:
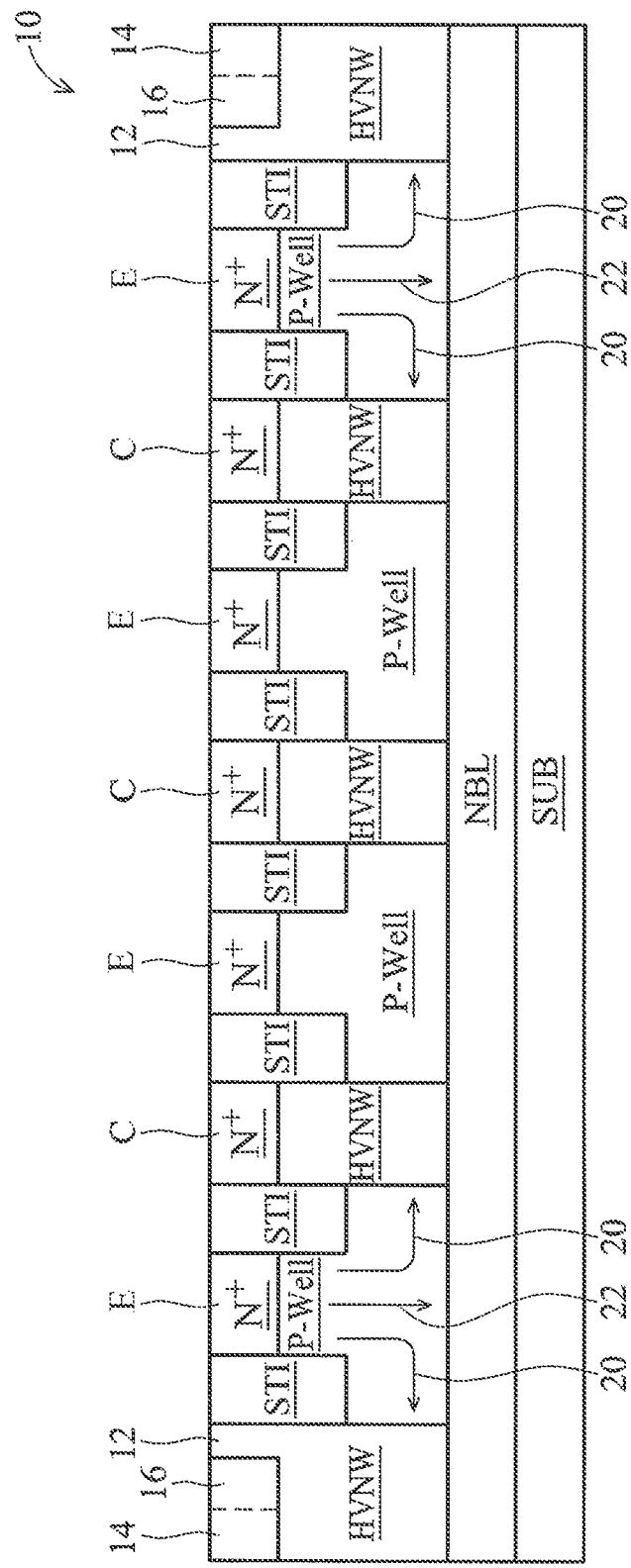

FIGS. 2A, 2B and 2C illustrate HVBJT 10 having a rectangular mash structure, which includes a plurality of rectangles. FIG. 2A is a top view of HVBJT 10. FIG. 2B is a cross-sectional view of the structure as shown in FIG. 2A, wherein the cross-sectional view is taken along a plane crossing line 2B-2B. FIG. 2C is also another cross-sectional view of the structure as shown in FIG. 2A, wherein the cross-sectional view is taken along a plane crossing line 2C-2C.

Referring to FIG. 2A, in an embodiment, the rectangles, which may also be squares, may be formed as an array. Throughout the description, each of the rectangles is referred to as a unit cell, and the rectangle including a collector therein is referred to as a collector unit cell, the rectangle including an emitter therein is referred to as an emitter unit cell, and the rectangle including a base contact therein is referred to as a base unit cell (please also refer to FIGS. 2B and 2C). HVBJT 10 includes a plurality of emitters E, collectors C, and base contacts B, each forming one of the unit cells. In an embodiment, each base unit cell includes base contact B, and an insulation region, which may be a shallow trench isolation (STI) region, encircling base contact B. Each emitter unit cell includes emitter E, and an insulation region encircling emitter E. In each collector unit cell, however, no insulation region is formed, while a heavily doped n-type (N+) region occupies an entirety of the collector unit cell (in a top view). In alternative embodiments, however, collector unit cells may also include insulation regions, similar to the emitter unit cells and the base unit cells.

In the array of HVBJT 10, collector unit cells may be allocated in each of the rows and each of the columns of the array in an alternating pattern, that is, every two immediately neighboring unit cells will include one, and only one, collector unit cell. The remaining unit cells of the array are shared by emitter unit cells and base unit cells. In an exemplary embodiment, in a first row, base unit cells and collector unit cells are allocated in an alternating pattern, while in a second row adjoining the first row, emitter unit cells and collector unit cells are allocated in an alternating pattern. The pattern in the first row and the second row may be repeated throughout the mesh structure.

HVBJT 10 may include high-voltage n-well (HVNW) region 12 substantially encircling the mesh structure of unit cells, wherein HVNW region 12 may be a lightly-doped n-type region. Further, heavily doped n-type (N+) region 14 may also be formed to encircle the mesh structure. It is noted that the terms "lightly doped" and "heavily doped" are terms of art, and may be defined differently depending on technology generations. N+ region 14 may be laterally spaced apart from the array of unit cells by HVNW region 12. In HVBJT 10, all of the base contacts B are electrically interconnected, for example, by metal lines (not shown). All of the emitters E are electrically interconnected. All of the collectors C are electrically interconnected by buried layer NBL as shown in FIGS. 2B and 2C, and possibly by additional metal lines. FIG. 2A also shows that some of the collectors C at the peripheral of the array are connected to N+ region 14 through N+ strips 16.

Referring to FIG. 2B, each base contact B is a heavily doped p-type (P+) region, and is formed over and contacting a p-well region. Accordingly, the base of HVBJT 10 includes the P+ regions and the p-well regions. The p-well regions may be substantially encircled by HVNW regions that may belong to collectors C. Each collector C includes an N+ region and an HVNW region underlying, and contacting, the N+ region. An n-type buried layer NBL is formed underlying, and contacting, the HVNW regions. Accordingly, buried layer NBL is electrically connected to all connectors C. Collectors C are thus interconnected by buried layer NBL into an integrated one, wherein the collector(s) of HVBJT 10 includes both the HVNW regions and buried layer NBL. Substrate SUB, which may be of p-type, is separated from the p-well regions by buried layer NBL. Also, the bottom surface of the insulation regions (STI regions) may be lower than the bottom surfaces of the P+ and N+ regions, but higher than the top surface of buried layer NBL.

Referring to FIG. 2C, each emitter E is formed over and contacting a p-well region. During the operation of HVBJT 10, electrons may be injected into collectors C from emitters E through paths denoted using arrows 20 and 22. Arrows 20 indicate the lateral electron-injection paths, while arrows 22 indicate the vertical electron-injection paths. It is noted that emitters E are laterally spaced apart from a neighboring HVNW region by only one relatively narrow STI region, and hence the lateral electron-injection paths 20 are short. Accordingly, the lateral electron-injection effect is strong. On the other hand, electrons may also be injected vertically from emitters E to buried layer NBL, as indicated by arrows 22. Therefore, the current gain of HVBJT 10 includes the contribution from both the lateral electron-injection effect and the vertical electron-injection effect, and hence is high.

The components of HVBJT 10 may be formed using existing CMOS HV processes, wherein the HVNW regions and buried layer NBL may be formed simultaneously with the formation of the HVNW regions and buried layer NBL, respectively, of CMOS HV devices (not shown). On the other hand, the p-well regions, the STI regions, the N+ regions, and the P+ regions may be formed simultaneously with the formation of like components in logic circuits and CMOS HV devices. However, no gate polys or resistive protection oxide (RPO) are needed (to laterally separate doped regions), although they can also be formed.

Figure 3A:
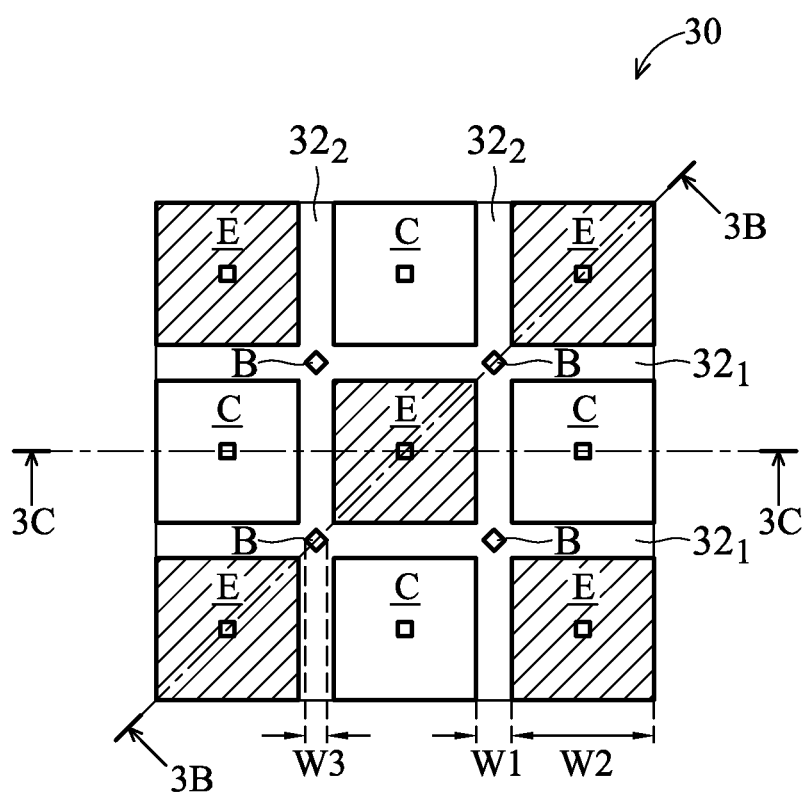
FIG. 3A and FIGS. 3B and 3C illustrate a top view and cross-sectional views, respectively, of a vertex-type HVBJT.
Figure 3B:
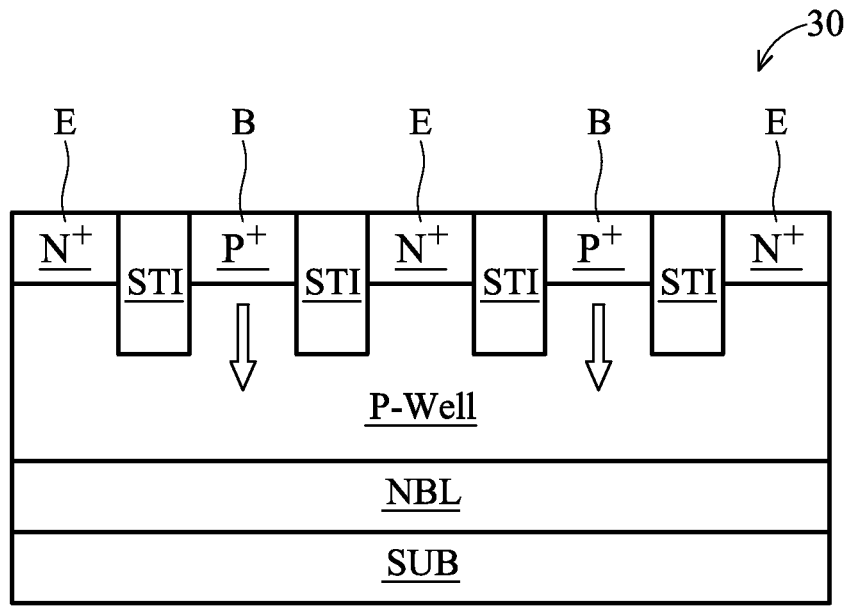
Figure 3C:
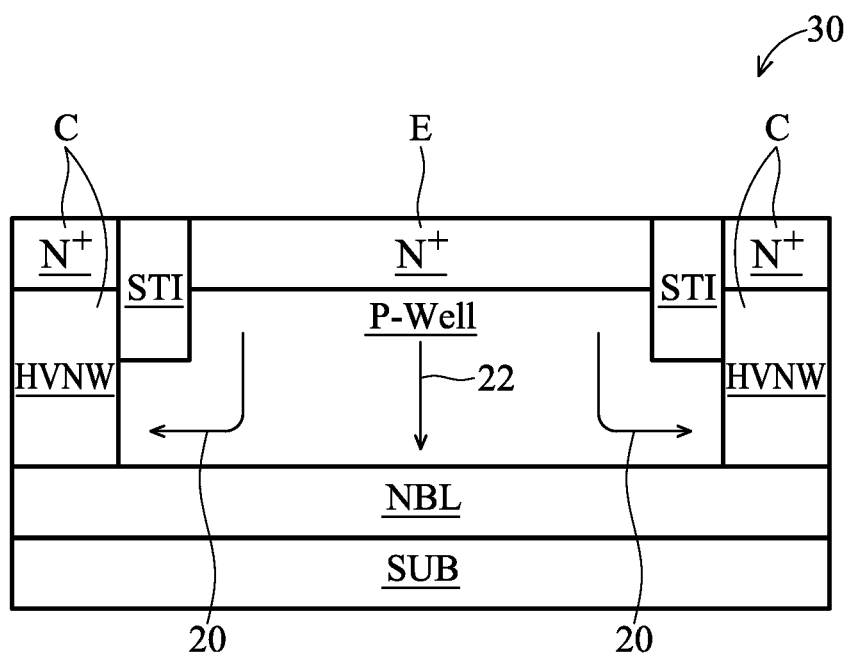

FIGS. 3A through 3C illustrate HVBJT 30 having a vertex structure. FIG. 3A is a top view of HVBJT 30. FIG. 3B is a cross-sectional view of the structure as shown in FIG. 3A, wherein the cross-sectional view is taken along a plane crossing line 3B-3B. FIG. 3C is also a cross-sectional view of the structure as shown in FIG. 3A, wherein the cross-sectional view is taken along a plane crossing line 3C-3C. Referring to FIG. 3A, insulation regions 32, such as STI regions, include horizontal insulation regions (strips) $32_1$ and vertical insulation regions (strips) $32_2$, which divide the respective chip area into a plurality of rectangles (possibly squares). Horizontal insulation strips $32_1$ and vertical insulation strips $32_2$ form an integrated insulation region, and hence insulation regions 32 may also be referred to as insulation region 32. Horizontal insulation strips $32_1$ may have a periodic pattern, for example, having equal spaces from each other. Vertical insulation strips $32_2$ may also have a periodic pattern, for example, having equal spaces from each other. Each of the rectangles includes either one emitter E or one collector C. The rectangles may be arranged as rows and columns, with emitters E and collectors C allocated in each of the rows and each of the columns in an alternating pattern. Since insulation regions 32 have the function of isolating each emitter E and collector C from others, in each of the rectangles, no insulation region needs to, although they can, be formed. In an embodiment, width W1 of insulation regions 32 may be less than width W2 of emitters E and/or collectors C. As shown in FIGS. 3B and 3C, entireties of the rectangles indicated as "E" or "C" may be N+ regions. Contact plugs (small rectangles in each collector C and emitter E) may be made to electrically interconnect collectors C, and to interconnect emitters E. In the entirety of HVBJT 30, all collectors C are electrically interconnected. All emitters E are electrically interconnected, and all base contacts B are electrically interconnected.

At the cross-section of a horizontal insulation strip $32_1$ and a vertical insulation strip $32_2$, there exists one base contact B, which is encircled by insulation region 32. Therefore, each base contact B is formed at the vertex of two emitters E and two collectors C. In an embodiment, since width W1 of insulation regions 32 is smaller than width W2 of emitters E and collectors C, width W3 (which is also the length of a longitudinal axis) of base contacts B may also be significantly smaller than width W2 of emitters E and collectors C. It is observed that with a small width W1 of insulation regions 32, the lateral distance between emitters E and neighboring collectors C is small. The small lateral distance is also made possible by the fact that base contacts B are not directly between emitters E and collectors C. Instead, base contacts B are formed outside of, but very close to, the space between neighboring emitters E and collectors C (also referred to as emitter-collector pairs). In other words, base contacts B are limited in the overlap region where horizontal insulation strips $32_1$ overlap vertical insulation strips $32_2$. The base resistance is thus reduced. In an embodiment, no base contacts B are in any intermediate region between any collector-emitter pairs (although a small portion of the tips of base contacts B may extend into the intermediate region). To achieve a small width W1 of insulation regions 32, base contacts B may have diamonds shapes, with the longitudinal axis parallel to the lengthwise direction of insulation strip 32. Accordingly, the longitudinal axes of the diamond-shaped base contacts have a length/width no greater than widths W1 of insulation strips $32_1$ or $32_2$.

FIG. 3B illustrates a cross-sectional view of emitters E and base contacts B. A p-well region extends under multiple emitters E and base contacts B. Again, an n-type buried layer NBL is formed underlying the p-well region.

Referring to FIG. 3C, each emitter E is formed over and contacting a p-well region. Each emitter E may be close to four collectors C (refer to FIG. 3A), although FIG. 3C only illustrates two of the four collectors C. Similar to the mesh-type HVBJTs, during the operation of HVBJT 30, electrons may be injected into collectors C from emitters E through two paths denoted using arrows 20 and 22. Arrow 20 indicates a lateral electron-injection path, while arrow 22 indicates a vertical electron-injection path. It is noted that emitter E is laterally spaced apart from the neighboring HVNW by only one relatively narrow STI, and hence the lateral electron-injection effect is strong. As a result, with the contribution of both the vertical electron-injection effect and the lateral electron-injection effect, the current gain of HVBJT 30 is high.

The embodiments of the present invention have several advantageous features. With the reduced lateral distance between emitters and collectors, the lateral electron-injection effect is increased, and hence the current gain of the resulting HVBJT is also increased. The chip area usage, on the other hand, is reduced due to the improved electron-injection efficiency.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit device comprising:
   a semiconductor substrate having a top surface;
   at least one insulation region extending from the top surface into the semiconductor substrate;
   a plurality of base contacts of a first conductivity type electrically interconnected to each other;
   a plurality of emitters of a second conductivity type opposite the first conductivity type, wherein the plurality of emitters is electrically interconnected to each other;
   a plurality of collectors of the second conductivity type electrically interconnected to each other, wherein each of the plurality of emitters, the plurality of collectors, and the plurality of base contacts are laterally spaced apart from each other by the at least one insulation region; and
   a buried layer of the second conductivity type in the semiconductor substrate, wherein the buried layer has an upper surface adjoining bottom surfaces of the plurality of collectors.

2. The integrated circuit device of claim 1, wherein the plurality of collectors is in an array comprising rows and columns of unit cells, and wherein the plurality of collectors is located in alternating ones of the unit cells in each of the rows and each of the columns.

3. The integrated circuit device of claim 2, wherein, in a first row of unit cells, the collectors and the base contacts are allocated in an alternating pattern, and in a second row adjoining the first row, the collectors and the emitters are allocated in an alternating pattern.

4. The integrated circuit device of claim 1, wherein each of the plurality of collectors comprises a heavily doped region, and a high-voltage well under the heavily doped region, wherein the high-voltage well electrically connects the heavily doped region to the buried layer.

5. The integrated circuit device of claim 1, wherein the plurality of base contacts and respective encircling insulation regions form a plurality of rectangular base unit cells, the plurality of emitters and respective encircling insulation regions form a plurality of rectangular emitter unit cells, and the plurality of collectors form a plurality of rectangular collector unit cells, and wherein the plurality of rectangular base unit cells, the plurality of rectangular emitter unit cells, and the plurality of rectangular collector unit cells form a mesh structure.

6. The integrated circuit device of claim 5, wherein the plurality of rectangular base unit cells, the plurality of rectangular emitter unit cells, and the plurality of rectangular collector unit cells have equal sizes.

7. The integrated circuit device of claim 5 further comprising a plurality of well regions of the first conductivity type underlying the plurality of emitters and overlying the buried layer, wherein the plurality of well regions is spaced apart from each other by the plurality of collectors.

8. The integrated circuit device of claim 5, wherein the mesh structure comprises an array.

9. The integrated circuit device of claim 1, wherein the at least one insulation region comprises a plurality of horizontal parallel insulation strips and a plurality of vertical parallel insulation strips interconnected to each other to divide the semiconductor substrate into a plurality of rectangles, and wherein one of the plurality of collectors and one of the plurality of emitters is in one of the plurality of rectangles.

10. The integrated circuit device of claim 9, wherein each of the plurality of base contacts is at an intersection of one of the plurality of horizontal parallel insulation strips and one of the plurality of vertical parallel insulation strips, and wherein each of the plurality of base contacts is encircled by, and adjoins, the at least one insulation region.

11. The integrated circuit device of claim 10, wherein the plurality of base contacts is outside of any region directly between any emitter-collector pair.

12. The integrated circuit device of claim 9, wherein the plurality of horizontal parallel insulation strips and the plurality of vertical parallel insulation strips have first widths less than about 80 percent of a second width of the plurality of rectangles.

13. An integrated circuit device comprising:
    a semiconductor substrate;

a high-voltage bipolar junction transistor comprising:
   a plurality of base unit cells, each comprising:
      a first heavily doped region of a first conductivity type; and
      a first insulation region in the semiconductor substrate and encircling the first heavily doped region;
   a plurality of emitter unit cells, each comprising:
      a second heavily doped region of a second conductivity type opposite the first conductivity type; and
      a second insulation region in the semiconductor substrate and encircling the second heavily doped region;
   a plurality of collector unit cells, each comprising:
      a third heavily doped region of the second conductivity type; and
      a high-voltage well region of the second conductivity type underlying and contacting the third heavily doped region, wherein the plurality of base unit cells, the plurality of emitter unit cells, and the plurality of collector unit cells are arranged as an array with rows and columns;
   a buried layer of the second conductivity type in the semiconductor substrate and having a top surface contacting a bottom surface of the high-voltage well region; and
   well regions of the first conductivity type between and adjoining the first heavily doped region and the buried layer, and between and adjoining the second heavily doped region and the buried layer.

14. The integrated circuit device of claim 13, wherein the plurality of base unit cells, the plurality of emitter unit cells, and the plurality of collector unit cells have substantially identical sizes.

15. The integrated circuit device of claim 13, wherein no edge of any of the plurality of base unit cells adjoins any edge of any of the plurality of emitter unit cells.

16. The integrated circuit device of claim 13, wherein the plurality of collector unit cells is in alternating positions in each of the rows and each of the columns of the array.

17. The integrated circuit device of claim 13 further comprising a high-voltage well ring encircling the plurality of base unit cells, the plurality of emitter unit cells, and the plurality of collector unit cells.

18. The integrated circuit device of claim 13, wherein the first heavily doped regions of all of the plurality of base unit cells are electrically interconnected, the second heavily doped regions of all of the plurality of emitter unit cells are electrically interconnected, and the third heavily doped regions of all of the plurality of collector unit cells are electrically interconnected.

19. The integrated circuit device of claim 13, wherein the first insulation region has a bottom surface lower than a bottom surface of the first heavily doped region, and higher than the top surface of the buried layer.

20. The integrated circuit device of claim 13, wherein the first conductivity type is p-type, and the second conductivity type is n-type.

\* \* \* \* \*